United States Patent
Cao et al.

(10) Patent No.: US 11,640,189 B2
(45) Date of Patent: May 2, 2023

(54) SOURCE-SIDE FAN-OUT STRUCTURE, ARRAY SUBSTRATE AND DISPLAY DEVICE

(71) Applicants: Chongqing HKC Optoelectronics Technology Co., Ltd., Chongqing (CN); HKC Corporation Limited, Guangdong (CN)

(72) Inventors: Junhong Cao, Chongqing (CN); Wei Li, Shenzhen (CN)

(73) Assignees: CHONGQING HKC OPTOELECTRONICS TECHNOLOGY CO., LTD., Chongqing (CN); HKC CORPORATION LIMITED, Guangdong (CN)

( * ) Notice: Subject to any disclaimer, the term of this patent is extended or adjusted under 35 U.S.C. 154(b) by 43 days.

(21) Appl. No.: 17/237,622

(22) Filed: Apr. 22, 2021

(65) Prior Publication Data
US 2022/0026966 A1 Jan. 27, 2022

(30) Foreign Application Priority Data

Jul. 27, 2020 (CN) .......................... 202010729576.7

(51) Int. Cl.
*G06F 1/18* (2006.01)
*H01L 27/12* (2006.01)

(52) U.S. Cl.
CPC ............ *G06F 1/189* (2013.01); *H01L 27/124* (2013.01)

(58) Field of Classification Search
CPC ....................................... H05K 5/00
See application file for complete search history.

(56) References Cited

U.S. PATENT DOCUMENTS

2018/0197484 A1* 7/2018 Moon ................. H01L 27/1248

* cited by examiner

*Primary Examiner* — Jerry Wu

(57) ABSTRACT

A source side fan-out structure includes: a height extension region, a height of a first side of the height extension region being greater than a height of a second side of the height extension region, wherein the first side of the height extension region is a side of the height extension region adjacent to a wiring of an array substrate, and the second side of the height extension region is a side of the height extension region away from the wirings of the array substrate; and a lead region provided with a plurality of fan-out leads therein, wherein the plurality of fan-out leads diverge from an inside of the height extension region.

20 Claims, 3 Drawing Sheets

SOURCE-SIDE FAN-OUT STRUCTURE, ARRAY SUBSTRATE AND DISPLAY DEVICE

CROSS-REFERENCE TO RELATED APPLICATIONS

This application claims the benefit of Chinese patent application no. 202010729576.7, filed on Jul. 27, 2020, the entire contents of which is incorporated herein in its entirety.

TECHNICAL FIELD

The present disclosure relates to the field of display technology, and in particular to a source-side fan-out structure, an array substrate, and a display device.

BACKGROUND

With the rapid development of science and technology, modern people tends to pursue a more excellent visual experiment, and thus a design of a panel with narrow bezels has become an important development trend of liquid crystal display devices. In order to meet the requirements of narrow bezel technology, a GOA (Gate Driver On Array) technology emerges. In a GOA circuit, a gate driver is formed on a thin film transistor array substrate with a fabrication process of a thin film transistor liquid crystal display array, such that a progressive-scan driving mode can be achieved. Such a GOA circuit would be designed on both left side and right side of a periphery of a panel display region to replace a general gate drive circuit. Signals are transmitted from a source-side driving chip to the GOA circuit through wirings of WOA (Wire On Array).

However, since the GOA circuit contains many signal lines and the wirings of WOA would take up a lot of space, a higher fan-out height is required, which make it impossible to implement a display panel driven by a GOA circuit with narrow bezels on the four sides.

SUMMARY

According to various embodiments, a source-side fan-out structure, an array substrate, and a display device are provided.

The fan-out structure includes: a height extension region, a height of a first side of the height extension region being greater than a height of a second side of the height extension region, wherein the first side of the height extension region is a side of the height extension region adjacent to a wiring of an array substrate, and the second side of the height extension region is a side of the height extension region away from the wirings of the array substrate; and a lead region provided with a plurality of fan-out leads therein, wherein the plurality of fan-out leads diverge from an inside of the height extension region.

An array substrate is provided including a display region and a non-display region, wherein the non-display region includes an upper bezel region, a lower bezel region, a left side bezel region, a right side bezel region, and a plurality of aforementioned fan-out structures arranged in the lower bezel region.

A display device is provided including the aforementioned array substrate.

According to an embodiment, by reducing the height of the height extension region at the second side, more polyline portions of the fan-out leads are inclined towards the second side of the height extension region, and the number of fan-out leads that are inclined towards the first side of the height extension region is reduced. As such, the height of the first side of the height extension region can be increased, and thus the space for the wirings of WOA adjacent to the first side of the height extension region can be increased. As a result, the space for the wirings of WOA can be increased without changing the height of the fan-out structure, and a narrow bezel design can be achieved.

These and other objects, advantages, purposes and features will become apparent upon review of the following specification in conjunction with the drawings.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout the views.

DETAILED DESCRIPTION OF THE PREFERRED EMBODIMENTS

Figure 1:
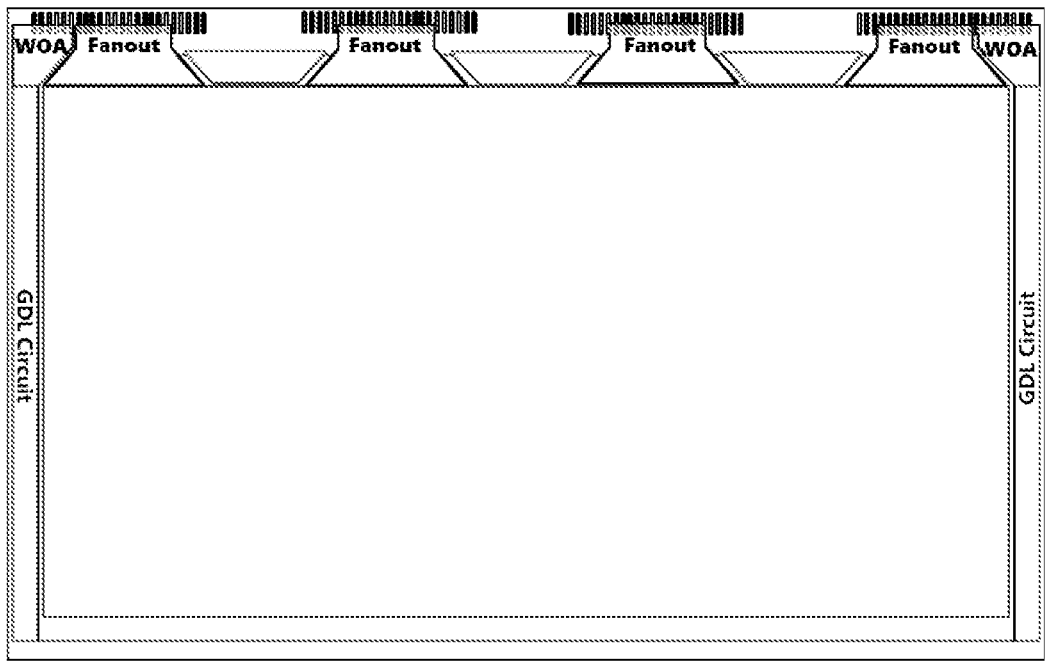
FIG. 1 is a schematic view of a conventional array substrate.

Embodiments of the invention are described more fully hereinafter with reference to the accompanying drawings. The various embodiments of the invention may, however, be embodied in many different forms and should not be construed as limited to the embodiments set forth herein. Rather, these embodiments are provided so that this disclosure will be thorough and complete, and will fully convey the scope of the invention to those skilled in the art. Elements that are identified using the same or similar reference characters refer to the same or similar elements.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Figure 2:
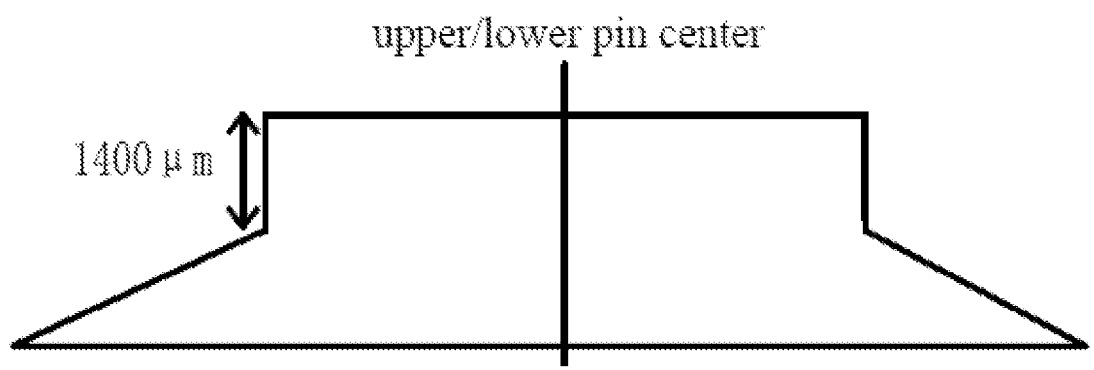
FIG. 2 is an enlarged view of a fan-out structure of FIG. 1.

Referring to FIG. 1 and FIG. 2, in a conventional display panel driven by a GOA circuit, signals are transmitted from a source-side driving chip to the GOA circuit through wirings of WOA. The signals are then provided to a display region to realize image display. However, since the GOA circuit contains many signal lines and the wirings of WOA would take up a lot of space, a higher fan-out height is necessary, which make it impossible to implement a display panel driven by a GOA circuit with narrow bezels on all four sides.

Figure 3:
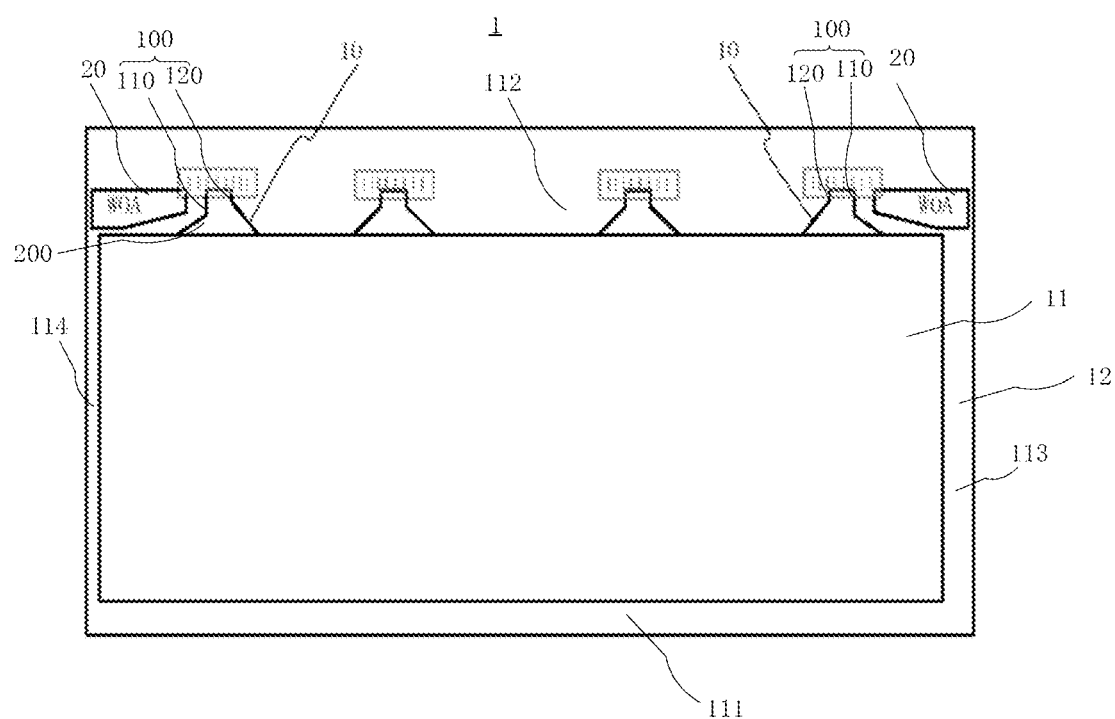
FIG. 3 is a schematic view of an array substrate according to an embodiment.
Figure 4:
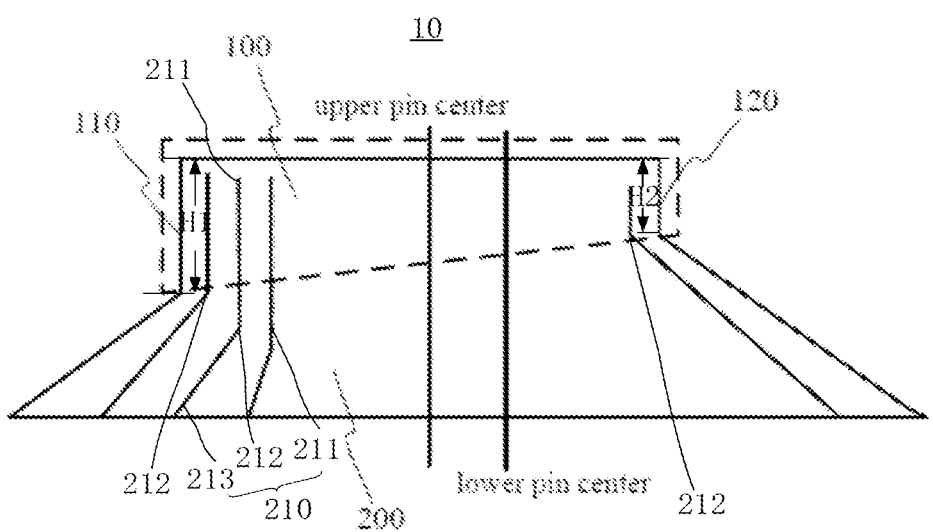
FIG. 4 is an enlarged view of a source-side fan-out structure of FIG. 3.

In view of the above-mentioned problems, according to an embodiment, a source-side fan-out structure 10 is provided and shown in FIG. 3 and FIG. 4. The fan-out structure 10 includes a height extension region 100 and a lead region 200. The height extension region 100 has a first side 110 and a second side 120. The first side 110 is a side of the height extension region 100 adjacent to a wiring of wire on array (WOA) 20, and the second side 120 is a side of the height extension region 100 away from the wirings of the wire on array 20. A height $H_1$ of a first side 110 is greater than a height $H_2$ of a second side 120. The lead region 200 is provided with a plurality of fan-out leads 210 therein, and the plurality of fan-out leads 210 diverge from an inside of the height extension region 100.

In this embodiment, the height $H_1$ of the height extension region 100 at the first side 110 is greater than the height $H_2$ of the height extension region 100 at the second side 120. By reducing the height $H_2$ of the height extension region 100 at the second side 120, more fan-out leads 210 are inclined towards the second side 120 of the height extension region 100, and the number of fan-out leads 210 that are inclined towards the first side 110 of the height extension region 100 is reduced. As such, the height $H_1$ of the first side 110 of the height extension region 100 can be increased, and thus the space for the wirings of WOA 20 adjacent to the first side 110 of the height extension region 100 can be increased. As a result, the space for the wirings of WOA 20 can be increased without changing the height of the fan-out structure 10, and an ultra-narrow bezel design can be achieved.

In one of the embodiments, the fan-out lead 210 includes a first straight line portion 211, a polyline portion 212, and a second straight line portion 213 which are connected in sequence. The first straight line portion 211 is a straight line segment extended from the inside of the height extension region 100, the second straight line portion 213 is a straight line segment connected to a data line of a display region, and both ends of the polyline portion 212 are respectively connected to the first straight line portion 211 and the second straight line portion 213. The first straight line portion 211 and the second straight line portion 213 are both parallel to an extending direction of a bezel of a display substrate of the array substrate. A first central axis of the lead region is not collinear with a second central axis of the lead region. The first central axis is a central axis of the first straight line portions 211 of the plurality of fan-out leads 210, and the second central axis is a central axis of the second straight line portions 213 of the plurality of fan-out leads 210. The polyline portion 212 of the fan-out lead 210 at the first side 110 of the height extension region 100 is at junction of the height extension region 100 and the lead region 200, and the polyline portion 212 of the fan-out lead 210 at the second side 120 of the height extension region 100 is at junction of the height extension region 100 and the lead region 200.

In this embodiment, the first central axis of the plurality of the fan-out leads 210 is a straight line passing through an upper pin (fixed) center of a fan-out region, i.e., the straight line passing through a symmetry center of an input end of the fan-out leads 210 at the height extension region 100 and being parallel to an extension direction of the first straight line portions 211. The second central axis of the plurality of the fan-out leads 210 is a straight line passing through a lower pin center of the fan-out region, i.e., the straight line passing through a symmetry center of an output end of the fan-out leads 210 and is parallel to the extension direction of the first straight line portions 211. It should be understood that, when the second central axis is closer to the second side 120 of the height extension region 100 than the first central axis, more polyline portions 212 of the fan-out leads 210 are inclined towards the second side 120 of the height extension region 100, and the number of fan-out leads 210 that are inclined towards the first side 110 of the height extension region 100 is reduced. As such, the height of the height extension region 100 at the first side 110 is increased. In addition, such polyline portion design can make sure that each fan-out lead 210 has a consistent total length, and thus make a delay on each fan-out lead 210 to be consistent, thereby ensuring that a signal on a source-side chip can reach each data line of the display region synchronously.

In one of the embodiments, the first straight line portion 211 of the fan-out lead 210 at the first side 110 of the height extension region 100 has a greater length than the first straight line portion 211 of the fan-out lead 210 at the second side 120 of the height extension region 100. It should be understood that, in order to make full use of the wiring area in the fan-out structure 10, a straight line portion of the fan-out lead 210 adjacent to a side of the height extension region 100 generally has the same height as that of the side of the height extension region 100. Accordingly, the greater the length of the straight line portion of the fan-out lead 210, the greater the height of the side of the adjacent height extension region 100.

In one of the embodiments, a distance between the first central axis and the second central axis is from 2000 μm to 4000 μm, which can effectively increase the height of the height extension region 100 at the first side 110, increase the space for the wirings of WOA 20 without increasing the height of the fan-out structure 10, and will not affect connections of the fan-out leads 210 to data lines.

In one of the embodiments, the first straight line portions 211 of the plurality of fan-out leads 210 are equally spaced, which can make full use of the wiring space in the fan-out structure 10, reduce the space occupied by the fan-out structure 10, and further reduce the thickness of the bezels of the display panel, thus achieving a narrower lower bezel. Likewise, the second straight line portions 213 of the plurality of fan-out leads 210 are also equally spaced.

In one of the embodiments, the fan-out lead 210 has a linewidth from 4 μm to 6 μm, and the spacing between the first straight line portions 211 of two adjacent fan-out leads 210 is from 5 μm to 7 μm. It should be understood that, the linewidth in the range of 4 μm-6 μm can prevent the lead from breaking due to a too thin linewidth during the manufacturing process, and can also prevent signal transmission from being affected by a higher resistance due to the too thin linewidth. In addition, if the linewidth of the fan-out lead 210 is too thick, the space occupied by the fan-out structure 10 will be increased, which is not favorable for the narrow bezel design.

In one of the embodiments, the height $H_1$ of the height extension region 100 at the first side 110 ranges from 1550 μm to 1750 μm, and the height $H_2$ of the height extension region 100 at the second side 120 is from 1100 μm to 1250 μm.

It should be understood that, the height of a conventional fan-out structure 10 is generally 5000 μm, and the height of the height extension region 100 is about 1400 μm. In this embodiment, the height $H_1$ of the height extension region 100 at the first side 110 is set in the range from 1550 μm to 1750 μm, and the height $H_2$ of the height extension region 100 at the second side 120 is set in the range from 1100 μm to 1250 μm, which can ensure the wiring space required by the plurality of fan-out leads 210, and increase the space for wirings of WOA 20 without changing the fan-out structure 10.

In one of the embodiments, in the same fan-out structure 10, the greater the height $H_1$ of the height extension region 100 at the first side 110, the smaller the height $H_2$ of the height extension region 100 at the second side 120, in other words, the height $H_1$ of the height extension region 100 at the first side 110 is inversely proportional to the height $H_2$ of the height extension region 100 at the second side 120. It should be understood that, the greater the height $H_1$ of the height extension region 100 at the first side 110, the less the number of fan-out leads 210 inclined towards the first side 110 of the height extension region 100, and the number of fan-out leads 210 inclined towards the second side 120 of the height extension region would be increased. In order to ensure that there are sufficient wiring spaces, the shorter the straight line portions of the fan-out leads 210, the smaller the height $H_2$ of the height extension region 100 at the second side 120.

Under the same inventive conception, as shown in FIG. 3, an array substrate 1 is further provided in one embodiment, which includes a display region 11 and a non-display region 12. The non-display region 11 includes an upper bezel region 111, a lower bezel region 112, a left bezel region 113, a right bezel region 114, and a plurality of fan-out structures 10 arranged in the lower bezel region 112. More specifically, the fan-out structure 10 that is adjacent to the left/right bezel region 113/114 is the fan-out structure 10 according to any of the above embodiments.

Figure 5:
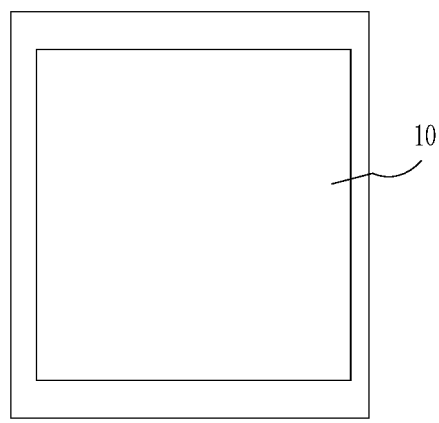
FIG. 5 is a schematic view of a display device according to an embodiment.

Under the same inventive conception, as shown in FIG. 5, a display device 1000 is further provided in one embodiment, which includes an array substrate 1 according to any of the above embodiments. The display device 1000 may be any product or component with a display function, such as a liquid crystal panel, an electronic paper, an OLED panel, a mobile phone, a tablet computer, a television, a monitor, a notebook computer, a digital photo frame, a navigator and etc.

Although the respective embodiments have been described one by one, it shall be appreciated that the respective embodiments will not be isolated. Those skilled in the art can apparently appreciate upon reading the disclosure of this application that the respective technical features involved in the respective embodiments can be combined arbitrarily between the respective embodiments as long as they have no collision with each other. Of course, the respective technical features mentioned in the same embodiment can also be combined arbitrarily as long as they have no collision with each other.

The foregoing descriptions are merely specific embodiments of the present invention, but are not intended to limit the protection scope of the present invention. Any variation or replacement readily figured out by a person skilled in the art within the technical scope disclosed in the present invention shall all fall within the protection scope of the present invention. Therefore, the protection scope of the present invention shall be subject to the protection scope of the appended claims.

What is claimed is:

1. An array substrate comprising, a display region and a non-display region, wherein the non-display region comprises an upper bezel region, a lower bezel region, a left side bezel region, a right side bezel region, and a plurality of fan-out structures arranged in the lower bezel region, wherein each source side fan-out structure comprising: a height extension region, a height of a first side of the height extension region being greater than a height of a second side of the height extension region, wherein the first side is parallel to the second side without any other adjacent electric line, wherein the first side of the height extension region is a side of the height extension region adjacent to a wiring of wire on array, and the second side of the height extension region is a side of the height extension region away from the wirings of the wire on array without any other adjacent electric line; and a lead region provided with a plurality of fan-out leads therein, wherein the plurality of fan-out leads diverge from an inside of the height extension region and beyond the region between the first and second sides of the height extension region, wherein each fan-out lead comprises a first straight line portion, a polyline portion, and a second straight line portion which are connected in sequence, the first straight line portion extends from the inside of the height extension region, the second straight line portion is connected to a data line of the display region of the array substrate, both ends of the polyline portion are connected to the first straight line portion and second straight line portion, respectively the first straight-line portion and the second straight line portion are both parallel to an extending direction of a bezel of a display substrate; and wherein the first straight line portion of the fan-out lead at the first side of the height extension region has a greater length than the first straight line portion of the fan-out lead at the second side of the height extension region.

2. The fan-out structure according to claim 1, wherein a first central axis of the lead region is not collinear with a second central axis of the lead region, the first central axis is a central axis of the first straight line portions, and the second central axis is a central axis of the second straight line portions.

3. The fan-out structure according to claim 2, wherein a distance between the first central axis and the second central axis is from 2000 μm to 4000 μm.

4. The fan-out structure according to claim 2, wherein the first straight line portions of the plurality of fan-out leads are equally spaced.

5. The fan-out structure according to claim 2, wherein the second straight line portions of the plurality of fan-out leads are equally spaced.

6. The fan-out structure according to claim 4, wherein the fan-out lead has a linewidth of from 4 μm to 6 μm, and the spacing between the first straight line portions of two adjacent fan-out leads is from 5 μm to 7 μm.

7. The fan-out structure according to claim 1, wherein the height of the height extension region at the first side ranges from 1550 μm to 1750 μm, and the height of the height extension region at the second side is from 1100 μm to 1250 μm.

8. The fan-out structure according to claim 1, wherein in the same fan-out structure, the height of the height extension region at the first side is inversely proportional to the height of the height extension region at the second side.

9. An array substrate comprising a display region and a non-display region, wherein the non-display region comprises an upper bezel region, a lower bezel region, a left side bezel region, a right side bezel region, and a plurality of fan-out structures arranged in the lower bezel region, wherein each source side fan-out structure comprising a height extension region, a height of a first side of the height extension region being greater than a height of a second side of the height extension region, wherein the first side is parallel to the second side without any other adjacent electric line, wherein the first side of the height extension region is a side of the height extension region adjacent to a wiring of wire on array, and the second side of the height extension region is a side of the height extension region away from the wirings of the wire on array without any other adjacent electric line; and a lead region provided with a plurality of fan-out leads therein, wherein the plurality of fan-out leads diverge from an inside of the height extension region and beyond the region between the first and second sides of the height extension region; wherein each fan-out lead comprises a first straight line portion, a polyline portion, and a second straight line portion which are connected in sequence, the first straight line portion extends from the inside of the height extension region, the second straight line portion is connected to a data line of a display region of the array substrate, both ends of the polyline portion are connected to the first straight line portion and the second straight line portion, respectively, the first straight line portion and the second straight line portion are both parallel to an extending direction of a bezel of a display substrate; and wherein the first straight line portion of the fan-out lead at the first side of the height extension region has a greater length than the first straight line portion of the fan-out lead at the second side of the height extension region.

10. The array substrate according to claim 9, wherein a first central axis of the lead region is not collinear with a second central axis of the lead region, the first central axis is a central axis of the first straight line portions, and the second central axis is a central axis of the second straight line portions.

11. The array substrate according to claim 10, wherein a distance between the first central axis and the second central axis is from 2000 µm to 4000 µm.

12. The array substrate according to claim 10, wherein the first straight line portions of the plurality of fan-out leads are equally spaced.

13. The array substrate according to claim 10, wherein the second straight line portions of the plurality of fan-out leads are equally spaced.

14. The array substrate according to claim 12, wherein the fan-out lead has a linewidth of from 4 µm to 6 µm, and the spacing between the first straight line portions of two adjacent fan-out leads is from 5 µm to 7 µm.

15. The array substrate according to claim 9, wherein the height of the height extension region at the first side ranges from 1550 µm to 1750 µm, and the height of the height extension region at the second side is from 1100 µm to 1250 µm.

16. The array substrate according to claim 9, wherein in the same fan-out structure, the height of the height extension region at the first side is inversely proportional to the height of the height extension region at the second side.

17. A display device comprising an array substrate wherein the array substrate comprises a display region and a non-display region, the non-display region comprises an upper bezel region, a lower bezel region, a left side bezel region, a right side bezel region, and a plurality of fan-out structures arranged in the lower bezel region; wherein each source side fan-out structure comprising: a height extension region, a height of a first side of the height extension region being greater than a height of a second side of the height extension region, wherein the first side is parallel to the second side without any other adjacent electric line, wherein the first side of the height extension region is a side of the height extension region adjacent to a wiring of wire on array, and the second side of the height extension region is a side of the height extension region away from the wirings of the wire on array without any other adjacent electric line; and a lead region provided with a plurality of fan-out leads therein wherein the plurality of fan-out leads diverge from an inside of the height extension region and beyond the region between the first and second sides of the height extension region; wherein each fan-out lead comprises a first straight line portion, a polyline portion, and a second straight line portion which are connected in sequence, the first straight line portion extends from the inside of the height extension region, the second straight line portion is connected to a data line of a display region of the array substrate both ends of the polyline portion are connected to the first straight line portion and the second straight line portion, respectively, the first straight line portion and the second straight line portion are both parallel to an extending direction of a bezel of a display substrate, and wherein the first straight line portion of the fan-out lead at the first side of the height extension region has a greater length than the first straight line portion of the fan-out lead at the second side of the height extension region.

18. The display device according to claim 17, wherein the display device is a liquid crystal panel, an electronic paper, an OLED panel, a mobile phone, a tablet computer, a television, a monitor, a notebook computer, a digital photo frame, or a navigator.

19. The fan-out structure according to claim 1, wherein the polyline portion of the fan-out lead at the first side of the height extension region is at junction of the height extension region and the lead region, and the polyline portion of the fan-out lead at the second side of the height extension region is at junction of the height extension region and the lead region.

20. The array substrate according to claim 9, wherein the polyline portion of the fan-out lead at the first side of the height extension region is at junction of the height extension region and the lead region, and the polyline portion of the fan-out lead at the second side of the height extension region is at junction of the height extension region and the lead region.

* * * * *